(12) United States Patent
Kim

(10) Patent No.: US 8,153,508 B2
(45) Date of Patent: Apr. 10, 2012

(54) METHOD FOR FABRICATING IMAGE SENSOR

(75) Inventor: Tae Gyu Kim, Masan-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 159 days.

(21) Appl. No.: 12/508,345

(22) Filed: Jul. 23, 2009

(65) Prior Publication Data
US 2010/0029032 A1 Feb. 4, 2010

(30) Foreign Application Priority Data

Jul. 29, 2008 (KR) .................. 10-2008-0074172

(51) Int. Cl.
*H01L 21/304* (2006.01)
(52) U.S. Cl. . 438/458; 438/406; 438/459; 257/E21.237; 257/E21.484
(58) Field of Classification Search .................... 438/63, 438/73, 406, 455, 459; 250/206
See application file for complete search history.

(56) References Cited

U.S. PATENT DOCUMENTS

| | | | |
|---|---|---|---|
| 5,028,558 A * | 7/1991 | Haisma et al. ..................... 438/3 |
| 5,244,817 A * | 9/1993 | Hawkins et al. ................. 438/64 |
| 5,277,748 A * | 1/1994 | Sakaguchi et al. ............ 438/406 |
| 5,869,387 A * | 2/1999 | Sato et al. ..................... 438/459 |
| 6,372,608 B1 * | 4/2002 | Shimoda et al. .............. 438/455 |
| 6,846,703 B2 * | 1/2005 | Shimoda et al. .............. 438/109 |
| 7,585,703 B2 * | 9/2009 | Matsumura et al. .......... 438/128 |
| 7,675,101 B2 * | 3/2010 | Hwang ......................... 257/292 |
| 7,816,714 B2 * | 10/2010 | Hwang ......................... 257/292 |
| 7,829,361 B2 * | 11/2010 | Wells .............................. 438/48 |
| 7,838,955 B2 * | 11/2010 | Shim .............................. 257/440 |
| 7,846,761 B2 * | 12/2010 | Hwang ........................... 438/69 |
| 7,867,808 B2 * | 1/2011 | Shim .............................. 438/66 |
| 7,875,917 B2 * | 1/2011 | Kim ............................... 257/292 |
| 7,880,196 B2 * | 2/2011 | Shim et al. ..................... 257/184 |
| 7,884,391 B2 * | 2/2011 | Hwang ......................... 257/184 |

(Continued)

FOREIGN PATENT DOCUMENTS

KR 10-2005-0117674 A 12/2005

OTHER PUBLICATIONS

Sang Yun Lee; "Image Sensor of Three-Dimensional Structure Using Depletion Region for Improving Yield and Manufacturing Method Thereof"; Korean Patent Abstracts; Publication No. 1020050117674 A; Publication Date: Dec. 15, 2005; Korean Intellectual Property Office, Republic of Korea.

*Primary Examiner* — David Vu
*Assistant Examiner* — Earl Taylor
(74) *Attorney, Agent, or Firm* — The Law Offices of Andrew D. Fortney; Andrew D. Fortney; Ryan S. Dunning

(57) ABSTRACT

A method for fabricating an image sensor is provided. In the image sensor fabrication method, an interconnection and a dielectric interlayer are formed on a semiconductor substrate including a readout circuit. An image sensing unit is formed on a carrier substrate of one side of a dielectric layer. The carrier substrate and the dielectric interlayer are bonded to each other. The dielectric layer and the carrier substrate are removed to leave the image sensing unit on the dielectric interlayer.

20 Claims, 8 Drawing Sheets

U.S. PATENT DOCUMENTS

| | | | |
|---|---|---|---|
| 2003/0087476 A1* | 5/2003 | Oohata et al. | 438/108 |
| 2004/0041930 A1* | 3/2004 | Chao et al. | 348/294 |
| 2005/0042841 A1* | 2/2005 | Boyd et al. | 438/458 |
| 2008/0038888 A1* | 2/2008 | Brederlow et al. | 438/251 |
| 2008/0079074 A1* | 4/2008 | Icel et al. | 257/347 |
| 2008/0143859 A1* | 6/2008 | Wells | 348/294 |
| 2009/0065823 A1* | 3/2009 | Hwang | 257/292 |
| 2009/0065824 A1* | 3/2009 | Hwang | 257/292 |
| 2009/0065825 A1* | 3/2009 | Hwang | 257/292 |
| 2009/0065826 A1* | 3/2009 | Hwang | 257/292 |
| 2009/0065827 A1* | 3/2009 | Hwang | 257/292 |
| 2009/0065828 A1* | 3/2009 | Hwang | 257/292 |
| 2009/0065829 A1* | 3/2009 | Kim | 257/292 |
| 2009/0065885 A1* | 3/2009 | Hwang | 257/435 |
| 2009/0065887 A1* | 3/2009 | Hwang | 257/461 |
| 2009/0066822 A1* | 3/2009 | Hwang | 348/294 |
| 2009/0159942 A1* | 6/2009 | Song | 257/292 |
| 2009/0166689 A1* | 7/2009 | Hwang | 257/292 |
| 2009/0166694 A1* | 7/2009 | Kim | 257/292 |
| 2009/0166786 A1* | 7/2009 | Shim | 257/440 |
| 2009/0166787 A1* | 7/2009 | Park | 257/458 |
| 2009/0166788 A1* | 7/2009 | Lim | 257/459 |
| 2009/0166789 A1* | 7/2009 | Shim | 257/459 |
| 2009/0166792 A1* | 7/2009 | Shim et al. | 257/462 |
| 2009/0166793 A1* | 7/2009 | Hwang | 257/462 |
| 2009/0179242 A1* | 7/2009 | Hwang | 257/292 |
| 2009/0179293 A1* | 7/2009 | Shim et al. | 257/458 |
| 2009/0179294 A1* | 7/2009 | Jang et al. | 257/461 |
| 2009/0179295 A1* | 7/2009 | Hwang | 257/461 |

* cited by examiner

METHOD FOR FABRICATING IMAGE SENSOR

CROSS-REFERENCE TO RELATED APPLICATIONS

The present application claims priority under 35 U.S.C.119 to Korean Patent Application No. 10-2008-0074172 (filed on Jul. 29, 2008), which is hereby incorporated by reference in its entirety.

BACKGROUND

The present disclosure relates to an image sensor.

Image sensors are semiconductor devices that convert an optical image into an electrical signal. The image sensors are generally classified into a charge-coupled device (CCD) image sensor and a complementary metal-oxide-silicon (CMOS) image sensor.

In general, a photodiode of an image sensor is formed through an ion implantation process on a substrate. However, as the size of a photodiode decreases in order to increase the number of pixels without increasing the chip size, the image quality degrades due to a decrease in the area of a light receiving unit.

Also, because the stack height (e.g., the combined thicknesses of the layers of materials on the image sensor) generally does not decrease as much as the corresponding decrease in the area of the light receiving unit, the number of photons entering the light receiving unit also decreases due to a light diffraction phenomenon called an airy disk.

As an alternative solution for overcoming the above limitation, an attempt is being made to form a photodiode by depositing amorphous silicon, or to form a readout circuit on a silicon substrate and form a photodiode on the readout circuit through a wafer-to-wafer bonding process, which is hereinafter referred to as a three-dimensional image sensor. Herein, the photodiode and the readout circuit are connected through a metal line (or interconnection).

In fabricating a three-dimensional image sensor, a wafer bonding process and a cleaving process are performed to form a photodiode layer on the image sensor. A hydrogen ion implantation process is performed for the cleaving process. However, the hydrogen ion implantation may cause a defect in the crystal structure of the wafer surface, and the defect in the wafer surface may degrade the dark characteristics of the image sensor (e.g., a dark current).

Also, a cleaving process is performed to form a photodiode with a desired thickness. However, the photodiode may have a non-uniform surface due to the cleaving process, which may degrade the bonding force (e.g., with either the substrate having subsequently deposited materials).

Meanwhile, because both the source and the drain of the transfer transistor are doped with a high concentration of N-type impurities, the related art approach may cause a charge sharing phenomenon as shown in FIG. 15. The charge sharing phenomenon may degrade the output image sensitivity, which may cause an image error. Also, the related may not smoothly transfer photo charges between the photodiode and the readout circuit, thus generating a dark current or degrading the saturation or sensitivity characteristics.

SUMMARY

Embodiments provide a method for fabricating an image sensor, which can implement the vertical integration of a photodiode and a transistor circuit.

In one embodiment, a method for fabricating an image sensor may comprise forming an interconnection and a dielectric interlayer on a semiconductor substrate including a readout circuit; preparing a carrier substrate including a carrier dielectric layer; forming an image sensing unit on the carrier substrate or one side of the carrier dielectric layer; bonding the carrier substrate and the dielectric interlayer to each other; and removing the carrier dielectric layer and the carrier substrate to leave the image sensing unit on the dielectric interlayer.

The details of one or more embodiments are set forth in the accompanying drawings and the description below. Other features will be apparent from the description and drawings, and from the claims.

DETAILED DESCRIPTION OF THE EMBODIMENTS

A method for fabricating an image sensor according to various embodiments will be described in detail with reference to the accompanying drawings.

The embodiments are not limited to a CMOS image sensor, but may be applicable to any image sensor (e.g., a CCD image sensor) that requires a photodiode.

Hereinafter, an exemplary method for fabricating an exemplary image sensor according to one or more embodiments will be described with reference to FIGS. 1 to 14.

Figure 1:
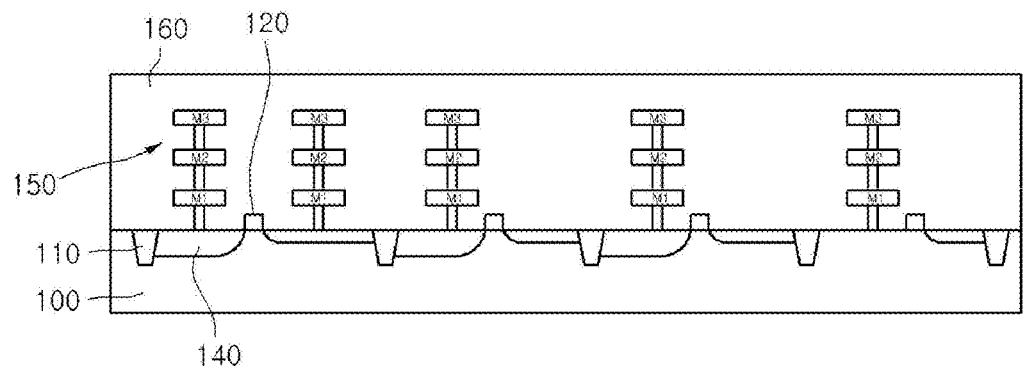
FIGS. 1-2 and 4-14 are cross-sectional views showing an exemplary process for fabricating an exemplary image sensor according to various embodiments.
Figure 2:
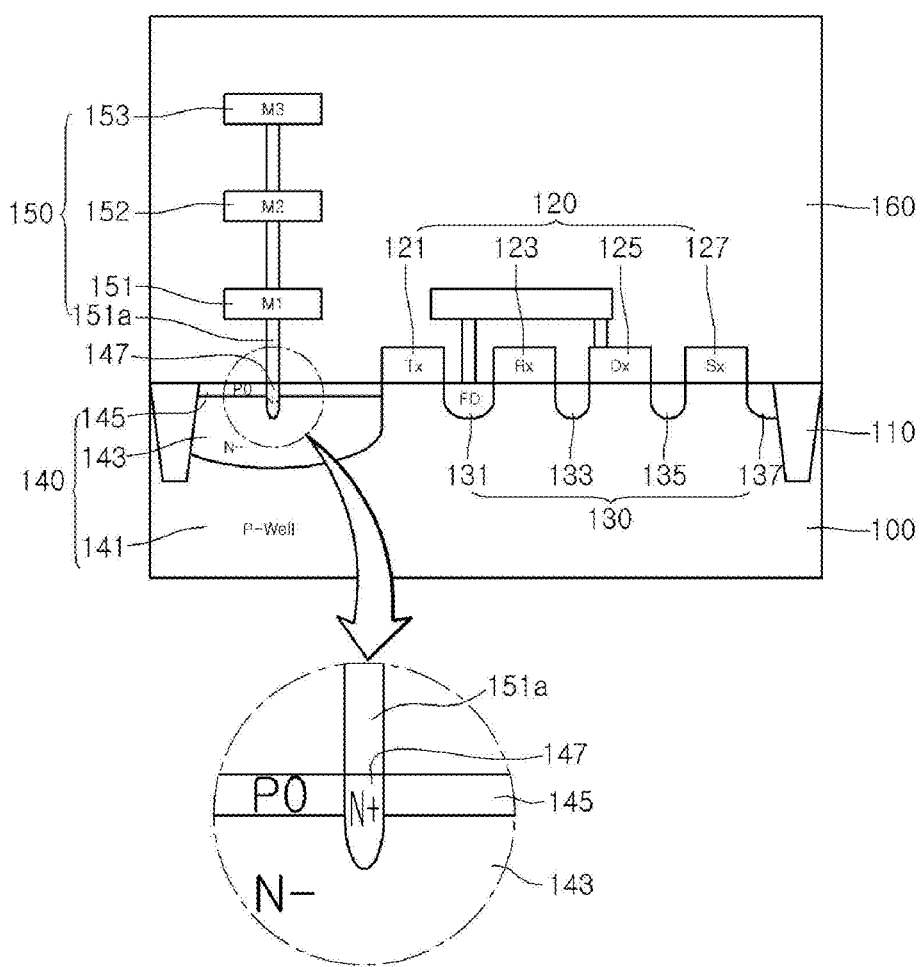

Referring to FIGS. 1 and 2, a readout circuit 120 is formed on a semiconductor substrate 100, and a metal interconnection 150 and a dielectric interlayer 160 are formed on the semiconductor substrate 100 over the readout circuit 120. The semiconductor substrate 100 may be a monocrystalline or polycrystalline silicon substrate, and may be a substrate doped with P-type impurities or N-type impurities. A device isolation layer 110 is formed in the semiconductor substrate 100 to define an active region. A readout circuit 120 including one or more transistors for each unit pixel is formed in the active region.

FIG. 2 is a detailed view of the readout circuit 120 shown in FIG. 1.

The readout circuit 120 and the metal interconnection 150 will be described in detail with reference to FIG. 2. The readout circuit 120 may include a transfer transistor (Tx) 121, a reset transistor (Rx) 123, a drive transistor (Dx) 125, and a select transistor (Sx) 127. Thereafter, an ion implantation region 130 including a floating diffusion region (FD) 131 and source/drain regions 133, 135 and 137 for the respective transistors may be formed. The readout circuit 120 may include three transistors (3 Tr), four transistors (4 Tr), or five transistors (5 Tr).

Forming the readout circuit 120 in the semiconductor substrate 100 may include forming an electrical junction region 140 in the semiconductor substrate 100; and forming a first conductivity type connection region 147, which is connected to the metal interconnection 150, on the electrical junction region 140. For example, the electrical junction region 140 may be a PN junction 140, to which the present invention is not limited. For example, the electrical junction region 140 may include: a first conductivity type ion implantation layer 143 formed on or in a second conductivity type well 141 or a second conductivity type epitaxial layer; and a second conductivity type ion implantation layer 145 formed on the first conductivity type ion implantation layer 143. For example, as shown in FIG. 2, the PN junction 140 may comprise a P0 (145)/N− (143)/P−(141) junction, to which the present invention is not limited. The semiconductor substrate 100 may have a second conductivity type, to which the present invention is not limited.

According to one or more embodiments, the device (e.g., electrical junction region 140, alone or in conjunction with the transfer transistor Tx) is designed to provide a potential difference between the source and drain of the transfer transistor (Tx), thus implementing the full dumping or transfer of a photo charge. Accordingly, a photo charge generated in the photodiode is dumped or transferred to the floating diffusion region, thereby increasing the output image sensitivity. That is, as shown in FIG. 2, the electrical junction region 140 in the semiconductor substrate 100 provides a potential difference between the source and drain of the transfer transistor (Tx) 121, thereby implementing the full dumping or transfer of a photo charge.

Figure 3:
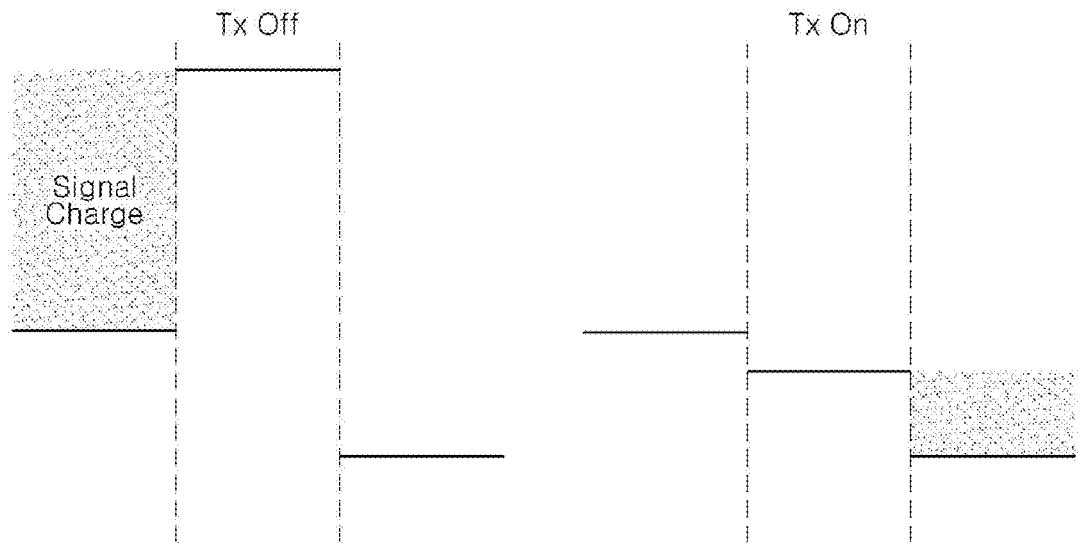
FIGS. 3 and 15 show the photo-charge characteristics of a readout circuit according to the present invention and the related art, respectively.

Hereinafter, a structure for transfer or dumping of photo charge(s) according to one or more embodiments will be described in detail with reference to FIGS. 2 and 3.

In one embodiment, unlike the floating diffusion (FD) 131 node (which includes an N+ junction), the P/N/P junction 140 of the electrical junction region 140 is pinched off at a predetermined voltage, without an applied voltage being fully transferred thereto. This voltage is called a pinning voltage. The pinning voltage depends on the P0 (145) and N− (143) doping concentration.

Specifically, electrons generated in a photodiode 200 are transferred to the PNP junction 140, and they are transferred to the FD (131) node to be converted into a voltage when the transfer transistor (Tx) 121 is turned on.

The maximum voltage of the P0/N−/P− junction 140 becomes a pinning voltage, and the maximum voltage of the FD (131) node becomes a voltage supply (e.g., Vdd) minus the threshold voltage of the reset transistor (Rx Vth). Therefore, as shown in FIG. 3, due to a potential difference across the source and drain terminals of the Tx 131, without charge sharing, electrons generated in the photodiode on the chip can be completely dumped or transferred to the FD (131) node.

That is, in one embodiment, a P0/N−/P-well junction is formed in the semiconductor (silicon) substrate 100, rather than an N+/P-well junction. The reason for this is that, in a 4-Tr APS reset operation, a positive (+) voltage is applied to the N− region (143) in the P0/N−/P-well junction, and a ground voltage is applied to the P0 region (145) and the P-well (141), and thus a P0/N−/P-well double junction generates a pinch-off at a predetermined voltage or higher like in a BJT structure. This is called a pinning voltage. Thus, a potential difference occurs between the source and drain of the Tx 121, and a photo charge is fully dumped or transferred from the N-well through the Tx to the FD in a Tx on/off operation (see FIG. 3), thus making it possible to prevent a charge sharing phenomenon. Thus, unlike the related art case of connecting a photodiode simply to an N+ junction, the embodiment makes it possible to prevent saturation reduction and sensitivity degradation.

Thereafter, a first conductivity type connection region 147 is formed in the substrate to enable an electrical connection between the photodiode and the readout circuit 120 and create a smooth transfer path for the photo charge, thereby making it possible to minimize a dark current source and reduce, minimize or prevent saturation reduction and sensitivity degradation.

To this end, one or more embodiments may form an N+ doped region as a first conductivity type connection region 147 for an ohmic contact on the surface of the P0/N−/P− junction 140. The N+ region 147 may pierce or completely penetrate the P0 implant region (145) to contact the N− implant region (143). Meanwhile, the width of the first conductivity type connection 147 may be minimized to minimize the probability that the first conductivity type connection 147 becomes a leakage source.

To this end, one or more embodiments may perform an ion implantation to form plug 147 after etching a contact hole for first metal contact 151a, to which the present invention is not limited. For example, an ion implantation pattern (not shown) may be formed, and it may be used as an ion implantation mask to form the first conductivity type connection region 147.

The reason for the local N+ doping of only a contact formation region is to minimize a dark signal and implement the smooth formation of an ohmic contact. If the entire Tx source region is N+ doped like the related art, a dark signal may increase due to an increased incidence of dangling bonds on the Si surface.

Figure 4:
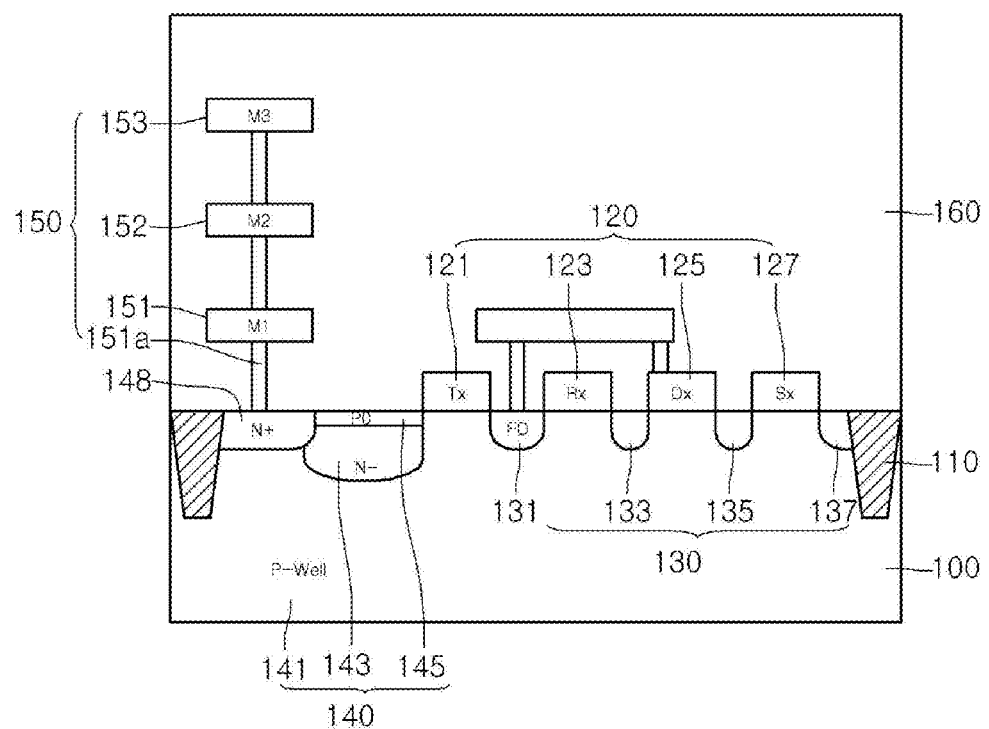

FIG. 4 shows another exemplary structure of the readout circuit. As shown in FIG. 4, a first conductivity type connection region 148 may be formed at one side of the electrical junction region 140.

Referring to FIG. 4, an N+ connection region 148 for an ohmic contact may be formed at (and optionally in contact with) a P0/N−/P− junction 140. The process of forming the N+ connection region 148 and an M1C contact 151a may result in one or more leakage sources. The reason for this is that an electric field (EF) may be generated in the substrate surface (Si surface) when a reverse bias is applied to the P0/N−/P− junction 140. In the presence of such an electric field, a crystal defect generated during the contact forming process may become a leakage source.

Also, if an N+ connection region 148 is formed on the surface of a P0/N−/P− junction 140, an electrical field may be added by the N+/P0 junction 148/145, which may also become a leakage source.

Thus, in some embodiments, a first contact plug 151a is formed in an active region including an N+ connection region 148 without a P0 implant (e.g., adjacent to P0 layer 145), and it is electrically connected to an N− junction 143. In such a structure, an electric field is not generated on the surface of the semiconductor substrate 100, which may reduce the dark current of a three-dimensional integrated (3-D integrated) CIS.

Thereafter, a dielectric layer 160 and a metal interconnection 150 may be formed on the semiconductor substrate 100. The metal interconnection 150 may include a first metal contact 151a, a first metal 151, a second metal 152, and a third metal 153, to which the present invention is not limited.

The dielectric layer 160 may comprise a premetal dielectric (PMD) layer in which contact 151a is formed, first and second intermetal dielectric (IMD) layers formed on first and second metal layers M1 151 and M2 152, respectively, in which contacts connecting an overlying metal layer (e.g., M2 152 and M3 153, respectively) to an underlying metal layer (e.g., M1 151 and M2 152, respectively) and on which the overlying metal layer (e.g., M2 152 and M3 153, respectively) are formed, and a passivation layer (not specifically shown, but substantially the entire portion of dielectric layer 160 above either the uppermost or the lowermost surface of third metal layer M3 153). Each of the PMD, IMD and passivation layers may comprise one or more insulators (e.g., a lowermost silicon nitride etch stop layer, a buffer layer comprising $SiO_2$ or silicon rich oxide [SRO], a bulk insulator such as $SiO_2$ or a fluorosilicate glass [FSG], and one or more capping layers such as a tetraethyl orthosilicate [TEOS]-based oxide and/or undoped silicate glass [USG], optionally in that order), and the passivation layer may be formed by chemical vapor deposition (CVD) of such materials, followed by planarization so that the third metal is not exposed. That is, the metal line 150 formed in the dielectric layer 160 is not exposed to the outside.

Alternatively, metal layer M1 151 and contact 151a may be formed by a single damascene process in a stack of dielectric layers comprising (in reverse sequence) a silicon nitride layer, a $SiO_2$ layer, a FSG layer, and a buffer layer, and metal layers M2 152 and M3 153 and the corresponding underlying contacts may be formed by a dual damascene process in a similar stack of dielectric layers but in which a silicon nitride etch stop layer may be formed in the middle of the FSG layer to define an etch stop for forming a trench in which the corresponding metal layer M2 152 or M3 153 is formed. In such an embodiment, the passivation layer may comprise a single USG or other $SiO_2$ layer. Therefore, the dielectric layer 160 having a planar uppermost surface profile is exposed on the semiconductor substrate 100.

Figure 5:
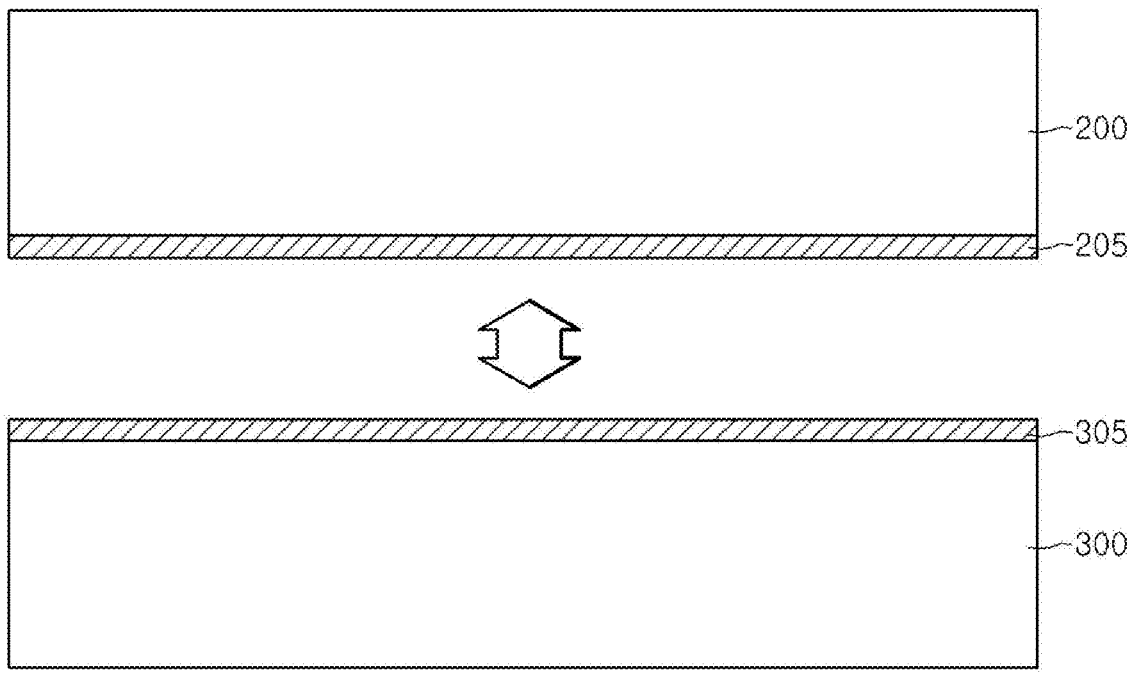
Figure 6:
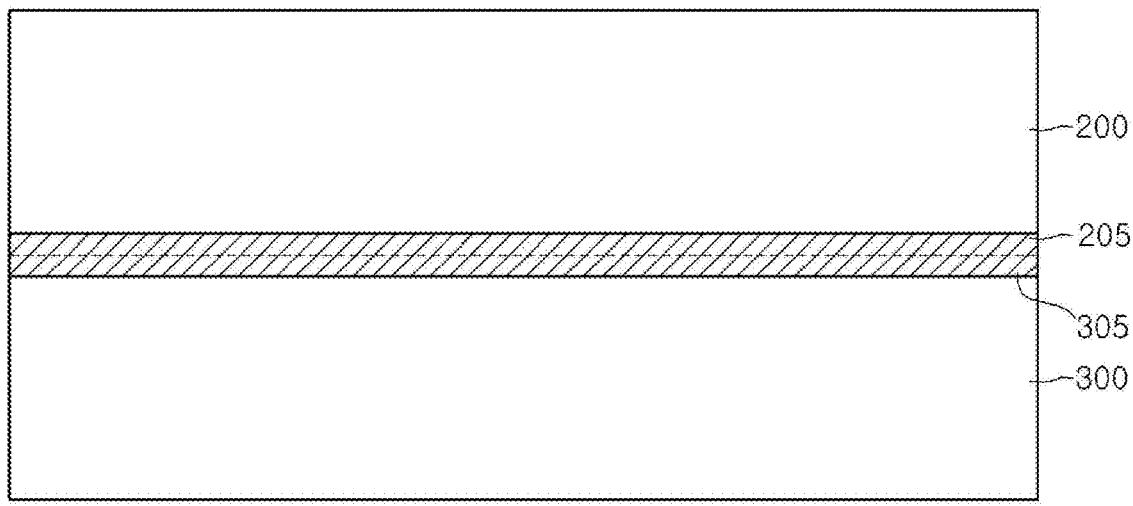

Referring to FIGS. 5 and 6, a first carrier substrate (a crystalline semiconductor substrate) 200 and a second, separate carrier substrate 300 are prepared. The first carrier substrate 200 may be a wafer including an image sensing unit, and the second carrier substrate 300 may be a dummy wafer for carrying the first carrier wafer 200.

For example, the first carrier substrate 200 and the second carrier substrate 300 may be monocrystalline or polycrystalline silicon substrates, and may be substrates doped with P-type or N-type impurities.

Dielectric layers 205 and 305 are formed on one surface of the first and second carrier substrates 200 and 300, respectively. The dielectric layers 205 and 305 may comprise the same material, although the invention is not limited thereto. The dielectric layers 205 and 305 may comprise an oxide layer and/or a nitride layer.

Thereafter, the first carrier substrate 200 and the second carrier substrate 300 are disposed oppositely, and a primary bonding process is performed thereon. That is, the dielectric layer 205 of the first carrier substrate 200 and the dielectric layer 305 of the second carrier substrate 300 are disposed oppositely (i.e., arranged facing each other), and then a primary bonding process is performed thereon. Herein, the first carrier substrate 200 may be disposed on the second carrier substrate 300.

Then, as shown in FIG. 6, the first carrier substrate 200 is bonded to the second carrier substrate 300. The first carrier substrate 200 and the second carrier substrate 300 are bonded together by the dielectric layers 205 and 305 comprising the same material. Therefore, the dielectric layers 205 and 305 are interposed between the first carrier substrate 200 and the second carrier substrate 300. The dielectric layer 205 of the first carrier substrate 200 and the dielectric layer 305 of the second carrier substrate 300 are bonded to form one dielectric layer. In one embodiment, the dielectric layers 205 and 305 are bonded thermally, for example by heating or annealing to a temperature near, at, or above the reflow temperature of the dielectric material, optionally with applied pressure. Alternatively (and particularly when the dielectric layers 205 and 305 each comprise a different surface material), an adhesive may be applied to one or both exposed surfaces of dielectric layers 205 and 305, and pressure may be applied thereto (optionally with heating to a temperature of, for example, about 300° C. or less). Thus, the dielectric layers 205 and 305 will be hereinafter denoted by a reference numeral 310.

Figure 7:
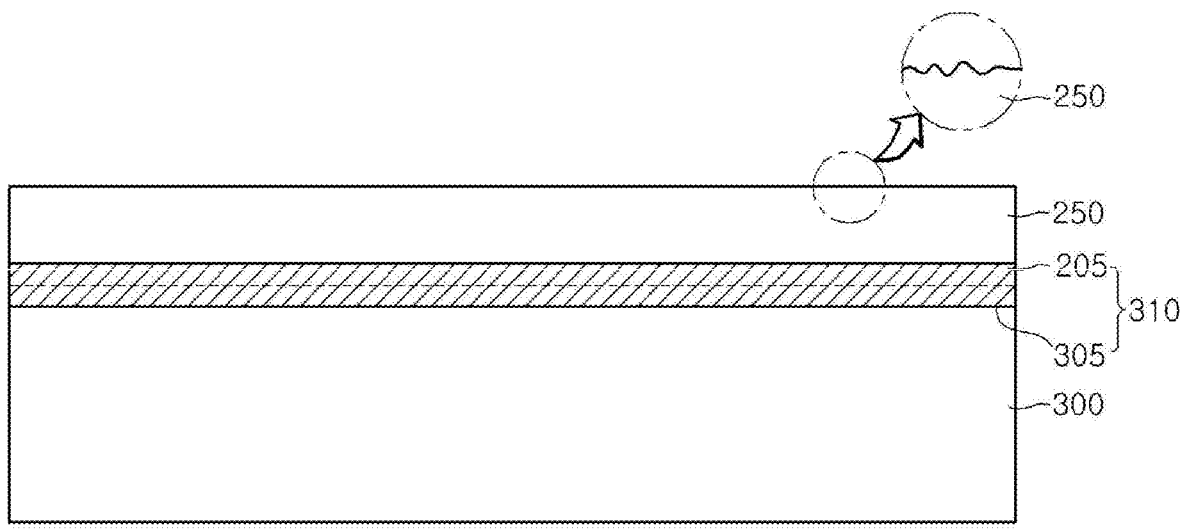

Referring to FIG. 7, a predetermined thickness of the first carrier substrate 200 is removed to form a first carrier pattern layer 250 on the second carrier substrate 300. The first carrier pattern layer 250 may be formed by performing a primary cleaving process on the first carrier substrate 200. For example, through the primary cleaving process, the removed thickness of the first carrier substrate 200 may be from about 0.1 μm to about 1.0 μm, and the thickness of the first carrier pattern layer 250 left on the second carrier substrate 300 may be from about 1.5 μm to about 2.0 μm.

The first carrier pattern layer 250 may be a region where an image sensing unit will be formed by ion implantation in subsequent processing. Herein, because the first carrier pattern layer 250 is formed through the primary cleaving process, its silicon lattice structure may be damaged or destroyed. That is, the first carrier pattern layer 250 may have a relatively (or unacceptably) high surface roughness due to surface damage caused by the cleaving process. If an image sensing unit is formed on the first carrier pattern layer 250 with the surface damage, the dark characteristics of the vertical image sensor may be degraded. Therefore, it is necessary to improve the surface (e.g., reduce the roughness) of the first carrier pattern layer 250.

Figure 8:
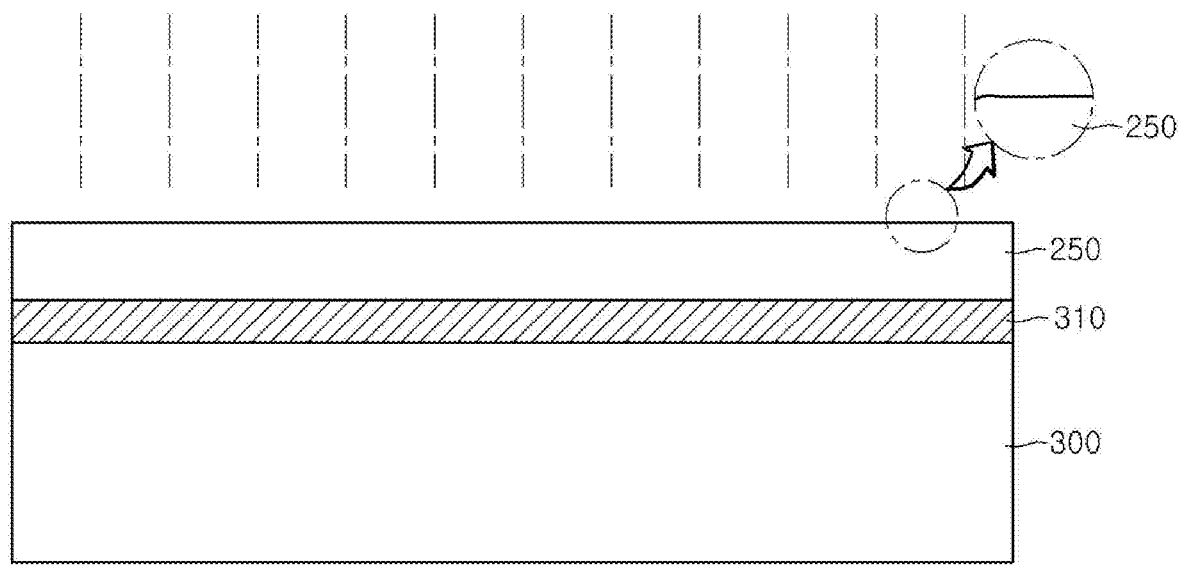

Referring to FIG. 8, a thermal treatment process is performed on the first carrier pattern layer 250 on the second carrier substrate 300. The thermal treatment process may be performed at a relatively high temperature. For example, the thermal treatment process may be performed at a temperature of from about 1000° C. to about 2000° C., generally for a length of time sufficient to reduce the surface roughness of the first carrier pattern layer 250.

When the first carrier pattern layer 250 is thermally treated at high temperatures, it can improve the surface roughness of the first carrier pattern layer 250. When the first carrier pattern layer 250 (comprising or consisting essentially of silicon) is thermally treated at high temperatures, the silicon atoms of the first carrier pattern layer 250 migrate (e.g., are transferred) due to the high temperature, and the silicon crystal structure is rearranged or reformed, thereby stabilizing the lattice structure. That is, the high-temperature thermal treatment cures defects in the silicon lattice structure of the first carrier pattern layer 250, thus making it possible to cure the surface damage.

Figure 9:
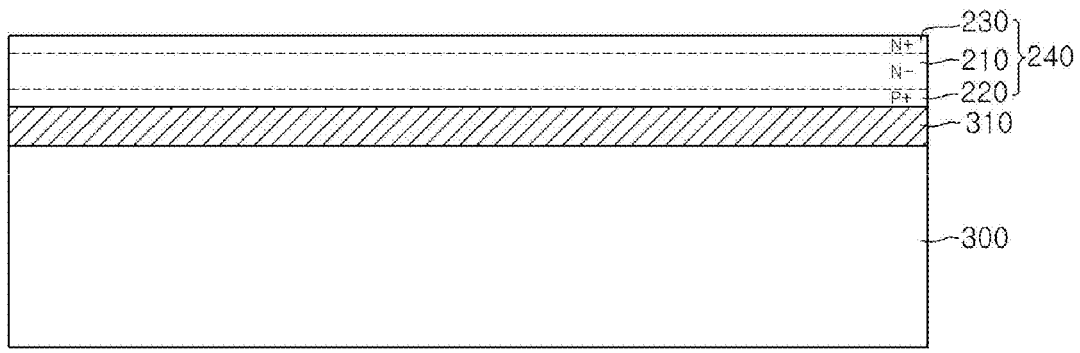

Referring to FIG. 9, an image sensing unit 240 is formed on or in the first carrier pattern layer 250.

The image sensing unit 240 may include a first impurity region 210 and a second impurity region 220. For example, the first impurity region 210 may be formed by ion-implanting a relatively low dose of N-type impurities into the first carrier pattern layer 250 at a predetermined energy and/or to a predetermined depth (e.g., from about 1.0 to about 2.0 μm). The second impurity region 220 may be formed under the first impurity region 210 by ion-implanting a relatively moderate dose of P-type impurities into a deep region of the first carrier pattern layer 250 (e.g., at a predetermined energy and/or to a predetermined depth, for example from about 1.2 to about 2.0 μm). The second impurity region 220 is formed under the first impurity region 210, so that the image sensing unit 240 may have a PN junction structure. Thus, the image sensing unit 240 may serve as a photodiode that generates a photo charge by receiving light.

Also, the first impurity region (N−) 210 generally has a greater thickness than the second impurity region (P+) 220, thereby making it possible to increase the charge storage capacity. That is, the N− layer 210 is thicker than the P+ layer 220, thereby making it possible to increase the photon containing capacity.

In addition, an ohmic contact layer 230 may be formed on or in the first impurity region 210. The ohmic contact layer 230 may be formed by ion-implanting a high concentration of N− type impurities at a predetermined energy (less than that of the first impurity region 210, when the impurity is the same) and/or to a predetermined depth (e.g., up to a depth of about 0.2 to about 0.5 μm). The ohmic contact layer 230 can reduce the contact resistance between the image sensing unit 240 and the metal interconnection 150. Alternatively, the ohmic contact layer 230 may be omitted.

Thus, an image sensing unit 240 is formed on the second carrier substrate 300, and a dielectric layer 310 is formed at the interface between the image sensing unit 240 and the second carrier substrate 300.

Figure 10:
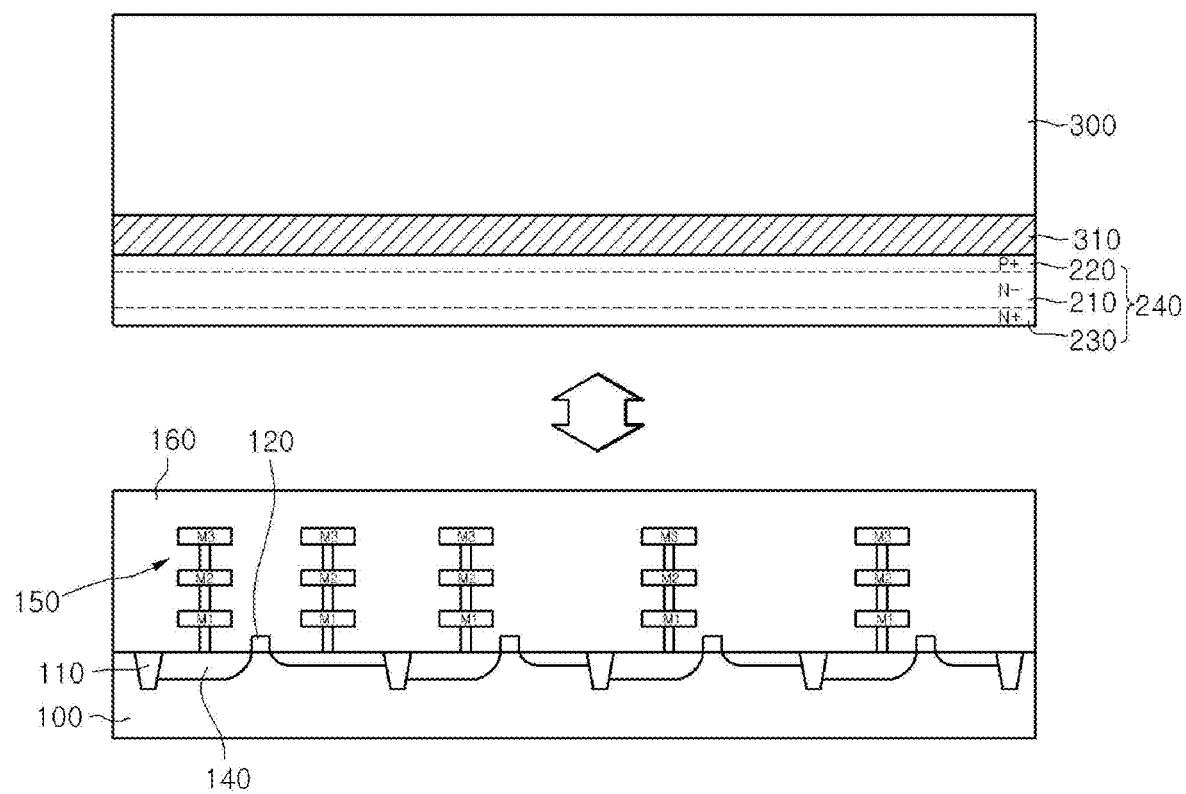
Figure 11:
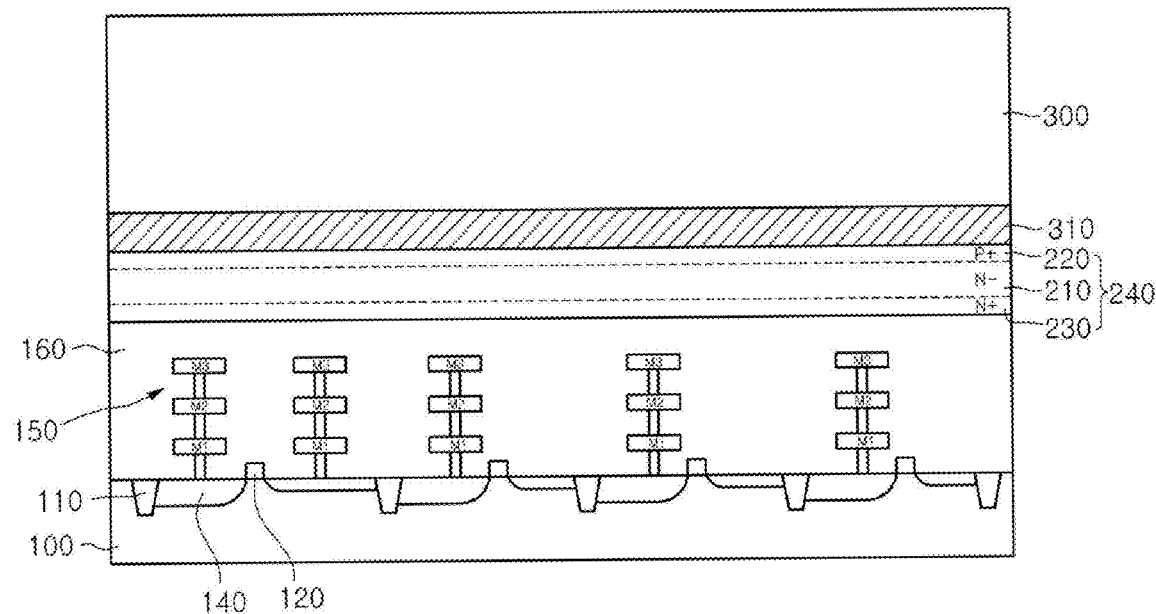

Referring to FIGS. 10 and 11, a secondary bonding process is performed to couple the semiconductor substrate 100 and the image sensing unit 240.

The secondary bonding process may be performed after disposing the dielectric layer 160 of the semiconductor substrate 100 and the image sensing unit 240 of the second carrier substrate 300 oppositely (e.g., arranging the dielectric layer 160 and the image sensing unit 240 face-to-face). That is, the secondary bonding process may be performed after rotating the second carrier substrate 300 by 180° to dispose the ohmic contact layer 230 of the image sensing unit 240 at the bottom so that the ohmic contact layer 230 faces the dielectric layer 160. Herein, the bonding process may be performed by increasing the surface energy of the surface(s) to be bonded by plasma activation before bonding the dielectric layer 160 and the image sensing unit 240. Meanwhile, in order to improve the bonding force, the bonding process may be performed with a dielectric layer and a metal layer interposed at the bonding interface.

Through the secondary bonding process, and as shown in FIG. 11, an image sensing unit 240, a dielectric layer 310, and a second carrier substrate 300 are stacked on the semiconductor substrate 100.

Defects in the bottom surface of the image sensing unit 240 (i.e., the bonding surface of the ohmic contact layer 230), which were caused by the primary cleaving process, were cured through the thermal treatment process before the formation of the image sensing unit 240, thus making it possible to improve the image quality.

Also, the secondary bonding process may be performed after the roughness of the bonding surface of the image sensing unit 240 is improved by curing the defect(s) (e.g., reducing the surface roughness). Thus, the electrical and/or physical bonding force(s) of the semiconductor substrate 100 and the image sensing unit 240 can be improved. Accordingly, the peeling phenomenon of the image sensing unit 240 from the dielectric layer 160 can be reduced or prevented.

Figure 12:
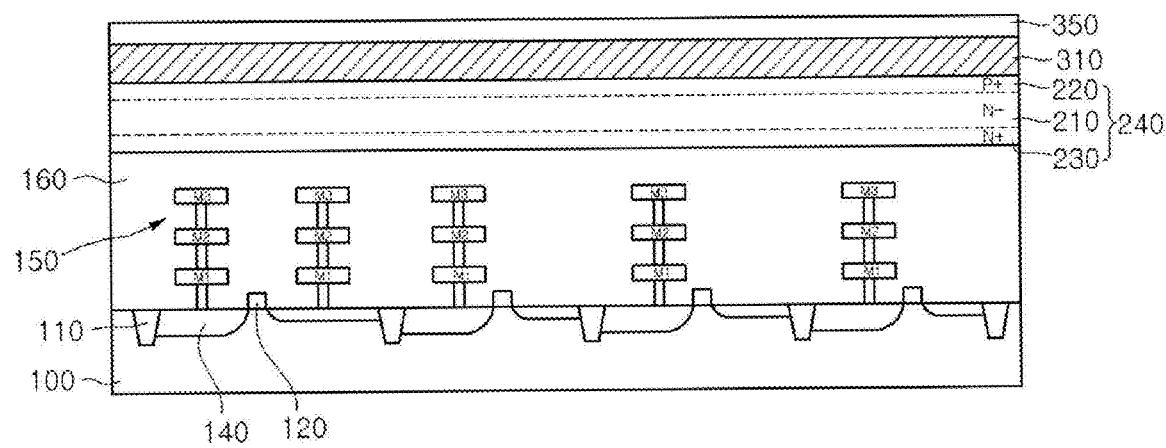

Referring to FIG. 12, a predetermined thickness of the second carrier substrate 300 is removed to form a second carrier pattern layer 350 on the image sensing unit 240. The second carrier pattern layer 350 may be formed by performing a secondary cleaving process on the second carrier substrate 300. The second carrier substrate 300 is preferably removed when its primary function is as a carrying unit for bonding the image sensing unit 240 on the semiconductor substrate 100.

Thus, the second carrier substrate 300 may be removed through the secondary cleaving process. At this point, for protection of the image sensing unit 240, only a portion of the second carrier substrate 300 may be removed in the secondary cleaving process. That is, the dielectric layer 310 and the second carrier pattern layer 350 may remain on the image sensing unit 240 after removing a portion of the second carrier substrate 300. Alternatively, all of the second carrier substrate 300 may be removed through the secondary cleaving process.

Figure 13:
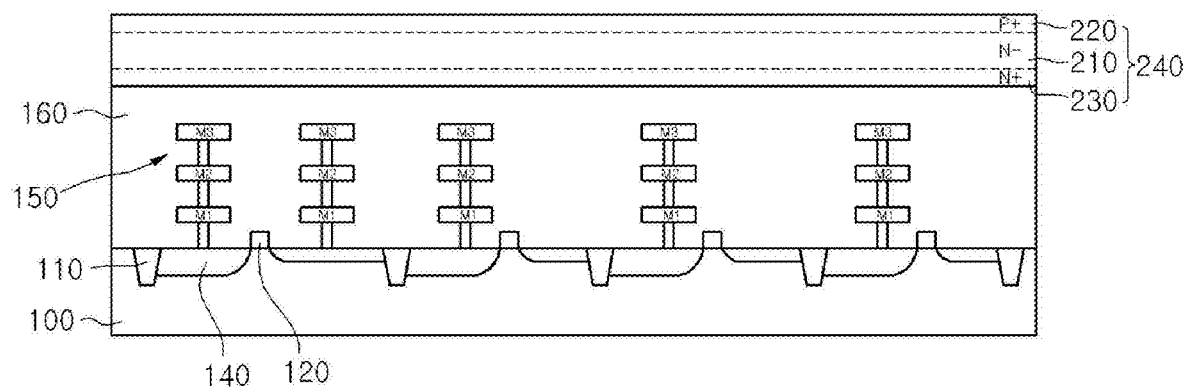

Referring to FIG. 13, the second carrier pattern layer 350 and the dielectric layer 310 on the image sensing unit 240 are removed. The second carrier pattern layer 350 and the dielectric layer 310 may be removed through one or more wet etching processes. Alternatively, the second carrier pattern layer 350 and/or the dielectric layer 310 may be removed separately by dry etching, or in a single step by planarization (e.g., chemical mechanical polishing).

When the second carrier pattern layer 350 and the dielectric layer 310 are removed (e.g., through one or more etching processes), the image sensing unit 240 is left on the dielectric layer 160 of the semiconductor substrate 100. Because the second carrier pattern layer 350 and the dielectric layer 310 can be substantially simultaneously removed from the image sensing unit 240 through the etching process (e.g., wet etching the dielectric layer 310 using dilute aqueous HF, which may be buffered with ammonia [e.g., aqueous $NH_4OH$] and/or ammonium fluoride), the surface damage of the image sensing unit 240 can be minimized, thus making it possible to improve the dark characteristics of the image sensor.

Figure 14:
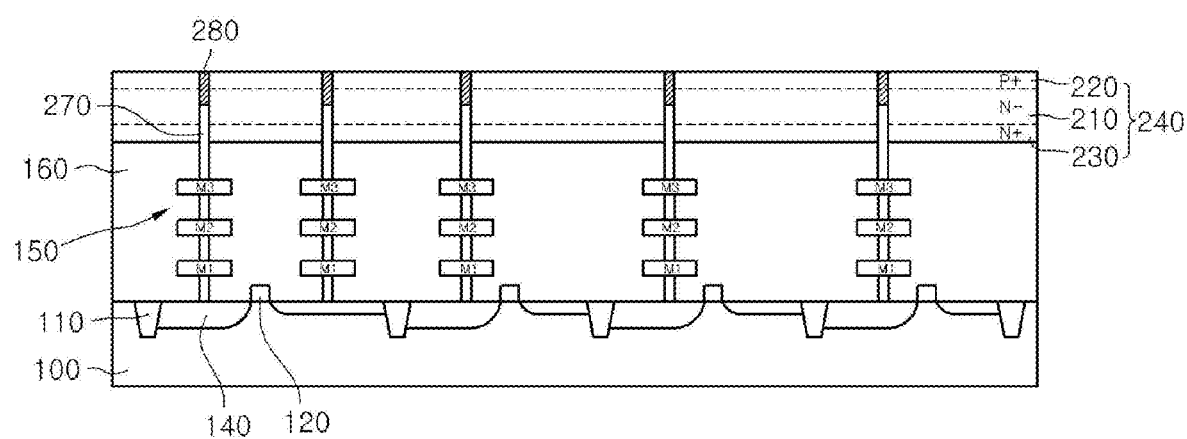
Figure 15:
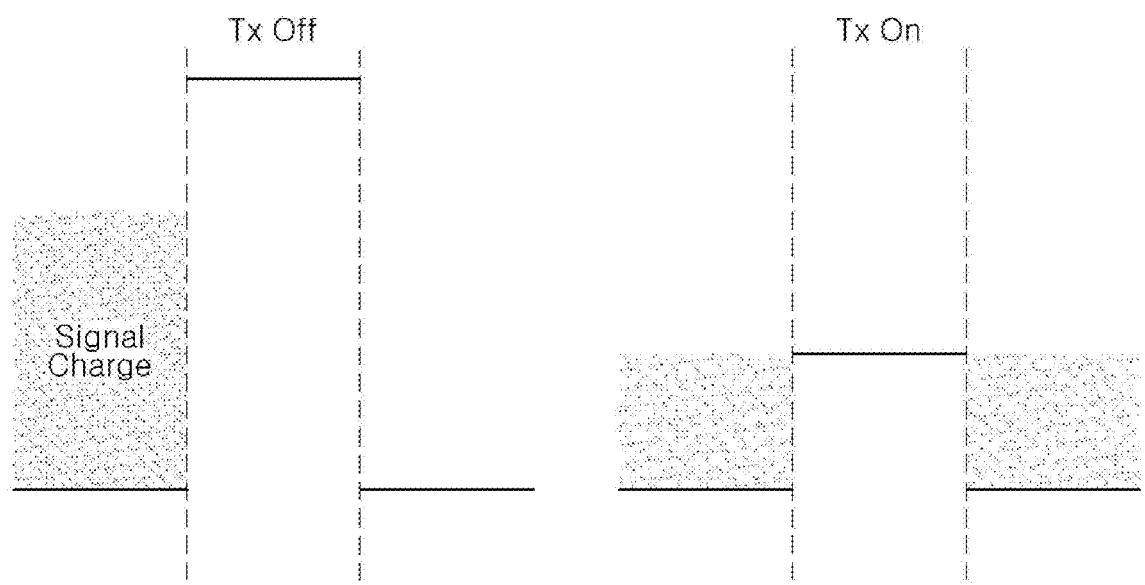

Referring to FIG. 14, a fourth metal contact 270 is formed to connect the image sensing unit 240 and the readout circuit 120. The fourth metal contact 270 may be formed by forming a deep via hole, which pierces or completely penetrates the image sensing unit 240 and the dielectric layer 160 to expose the third metal (M3), and filling the deep via hole with a conductive material such as tungsten or aluminum. Although not shown, a barrier metal such as TiN or a TiN-on-Ti bilayer may be formed before deposition of the metal for the fourth metal contact 270. The fourth metal contact 270 may be electrically connected to the first impurity region 210 and the ohmic contact layer 230, and may be electrically isolated from the second impurity region 220. Thus, a dielectric pattern or plug 280 may be formed in the via hole corresponding to the region over the fourth metal contact 270 by selectively etching back the fourth metal contact 270 to a predetermined depth (generally greater than a thickness of the P0 region 220), then filling the hole with a dielectric material (such as silicon dioxide).

Although not shown in the drawings, after the formation of the fourth metal contact 270, a pixel isolation layer isolating the image sensing unit 240 on a unit pixel basis, a top electrode connected to the second impurity region, a color filter, and a microlens are formed (generally in sequence) on the image sensing unit 240 to fabricate the image sensor.

As described above, the embodiments provides a three-dimensional image sensor having an image sensing unit disposed over the readout circuit, thus making it possible to increase the fill factor and reduce, minimize, repair or prevent defects in the image sensing unit.

Also, the thermal treatment process performed after the cleaving process on the first carrier pattern layer for formation of the image sensing unit makes it possible to cure defects in the silicon lattice structure caused or induced by the cleaving process. Accordingly, it is possible to improve the leakage characteristics and the dark characteristics of the image sensing unit.

Also, because the roughness of the bonding surface of the image sensing unit is improved by the thermal treatment process, the bonding force with respect to the dielectric layer and the ohmic contact layer 230 and/or image sensing unit 240 is increased, thus making it possible to reduce, minimize or prevent the peeling phenomenon.

Also, because one or more dielectric layers are formed at the interface between the substrate carrying the image sensing unit and a second carrier substrate, and the second carrier substrate and the dielectric layer are removed (e.g., in an etching process), defects in the image sensing unit may be prevented, thereby making it possible to improve the image quality.

Any reference in this specification to "one embodiment," "an embodiment," "example embodiment," etc., means that a particular feature, structure, or characteristic described in connection with one or more embodiments is included in at least one embodiment of the invention. The appearances of such phrases in various places in the specification are not necessarily all referring to the same embodiment. Further, when a particular feature, structure, or characteristic is described in connection with any embodiment, it is within the purview of one skilled in the art to effect such feature, structure, or characteristic in connection with other embodiments.

Although various embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for fabricating an image sensor, comprising:
    forming an interconnection and a dielectric interlayer on a semiconductor substrate including a readout circuit;
    preparing first and second carrier substrates, each including a surface dielectric layer;
    forming a first carrier pattern layer on the second carrier substrate by cleaving the first carrier substrate;
    performing a thermal treatment process on the first carrier pattern layer;
    forming an image sensing unit on or in the first carrier pattern layer, wherein the surface dielectric layers are between the image sensing unit and the second carrier substrate;
    bonding the image sensing unit and the dielectric interlayer; and
    removing the surface dielectric layers and the second carrier substrate to leave the image sensing unit on the dielectric interlayer.

2. The method according to claim 1, wherein removing the surface dielectric layers comprises a first wet etching process.

3. The method according to claim 2, wherein removing the second carrier substrate comprises the first wet etching process, a second wet etching process, a dry etching process, or planarization.

4. The method according to claim 3, wherein removing the second carrier substrate comprises the first wet etching process.

5. The method according to claim 1, further comprising, prior to performing the thermal treatment process, placing the surface dielectric layers face to face, and applying pressure to opposite sides of the first and second carrier substrates.

6. The method according to claim 1, wherein the thermal treatment process is performed at temperatures of about 1000° C. to about 2000° C.

7. The method according to claim 1, wherein the first and/or second carrier substrates comprise crystalline silicon.

8. A method for fabricating an image sensor, comprising:
    forming an interconnection and a dielectric interlayer on a semiconductor substrate including a readout circuit;
    forming an image sensing unit on or in a carrier substrate, wherein a carrier dielectric layer is between the image sensing unit and the carrier substrate;
    bonding the image sensing unit and the dielectric interlayer;
    cleaving the carrier substrate; and
    after cleaving the carrier substrate, removing the carrier dielectric layer and the carrier substrate to leave the image sensing unit on the dielectric interlayer.

9. The method according to claim 3, wherein removing the second carrier substrate further comprises cleaving the second carrier substrate.

10. A method for fabricating an image sensor, comprising:
    forming an interconnection and a dielectric interlayer on a semiconductor substrate including a readout circuit;
    forming a dielectric layer on each of first and second carrier substrates;
    performing a primary bonding process to bond the dielectric layers of the first and second carrier substrates to each other;
    forming a first carrier pattern layer on the first carrier substrate by removing a portion of the first carrier substrate through a primary cleaving process;
    forming an image sensing unit in or on the first carrier pattern layer;
    performing a secondary bonding process to bond the dielectric interlayer and the image sensing unit to each other; and
    removing the dielectric layers and the second carrier substrate to leave the image sensing unit on the dielectric interlayer.

11. The method according to claim 10, further comprising performing a thermal treatment process on the first carrier pattern layer after forming the first carrier pattern layer.

12. The method according to claim 11, wherein the thermal treatment process is performed at a temperature of about 1000° C. to about 2000° C.

13. The method according to claim 10, further comprising forming a second carrier pattern layer by cleaving a portion of the second carrier substrate after performing the secondary bonding process.

14. The method according to claim 10, wherein removing the dielectric layer comprises a wet etching process.

15. The method according to claim 14, wherein removing of the dielectric layer simultaneously removes the second carrier pattern layer.

16. The method according to claim 8, wherein removing the carrier dielectric layer comprises a first wet etching process.

17. The method according to claim 16, wherein removing the carrier substrate comprises the first wet etching process, a second wet etching process, a dry etching process, or planarization.

18. The method according to claim 17, wherein removing the carrier substrate comprises the first wet etching process.

19. The method according to claim 8, wherein the carrier substrate comprises crystalline silicon.

20. The method according to claim 8, wherein the carrier dielectric layer comprises first and second carrier dielectric layers bonded together.

* * * * *